US008038804B2

(12) United States Patent
Kinoshita et al.

(10) Patent No.: US 8,038,804 B2
(45) Date of Patent: Oct. 18, 2011

(54) METHOD FOR DRYING A SURFACE

(75) Inventors: Kei Kinoshita, Villach (AT); Philipp Engesser, Lindau (DE)

(73) Assignee: Lam Research AG, Villach (AT)

( * ) Notice: Subject to any disclaimer, the term of this patent is extended or adjusted under 35 U.S.C. 154(b) by 448 days.

(21) Appl. No.: 11/914,315

(22) PCT Filed: Apr. 11, 2006

(86) PCT No.: PCT/EP2006/061522
§ 371 (c)(1),
(2), (4) Date: Nov. 13, 2007

(87) PCT Pub. No.: WO2007/054377
PCT Pub. Date: May 18, 2007

(65) Prior Publication Data
US 2008/0190455 A1    Aug. 14, 2008

(30) Foreign Application Priority Data
May 13, 2005    (AT) .................................. A 831/2005

(51) Int. Cl.
*B08B 3/04* (2006.01)
*B08B 5/02* (2006.01)
(52) U.S. Cl. .................. 134/37; 134/30; 134/33
(58) Field of Classification Search .............. 134/30, 134/37
See application file for complete search history.

(56) References Cited

U.S. PATENT DOCUMENTS

| 5,271,774 | A  |   | 12/1993 | Leenaars et al. |
|-----------|----|---|---------|-----------------|
| 5,882,433 | A  | * | 3/1999  | Ueno ............................ 134/31 |
| 5,997,653 | A  | * | 12/1999 | Yamasaka ....................... 134/2 |
| 2001/0047595 | A1 | * | 12/2001 | Mehmandoust ................ 34/443 |
| 2002/0062840 | A1 | * | 5/2002  | Verhaverbeke et al. ....... 134/1.3 |
| 2002/0121286 | A1 |   | 9/2002  | Verhaverbeke et al. |
| 2003/0159713 | A1 | * | 8/2003  | Park et al. ......................... 134/2 |
| 2006/0048792 | A1 | * | 3/2006  | Nakamura et al. .............. 134/2 |
| 2006/0234503 | A1 |   | 10/2006 | Yamada et al. |

FOREIGN PATENT DOCUMENTS

| TW | 556255 | 10/2003 |
| TW | 230389 | 4/2005 |
| TW | 200509234 | 7/2005 |
| WO | 02/054456 | 7/2002 |
| WO | WO 02/054456 | 7/2002 |
| WO | WO 2005/015627 | * 2/2005 |

* cited by examiner

*Primary Examiner* — Michael Barr
*Assistant Examiner* — Natasha Campbell
(74) *Attorney, Agent, or Firm* — Young & Thompson

(57) ABSTRACT

Method for drying a surface of a disc-shaped article includes covering the surface with a rinsing liquid, whereby a closed liquid layer is formed, and removing the rinsing liquid, wherein the rinsing liquid containing at least 50 wt. % water and at least 5 wt. % of a substance, wherein the substance lowers the surface energy of water, wherein the removing of the liquid is initiated by blowing gas onto the closed liquid layer, whereby the closed liquid layer is opened at on discrete area.

15 Claims, 2 Drawing Sheets

METHOD FOR DRYING A SURFACE

BACKGROUND OF THE INVENTION

The invention relates to a method for drying a surface. More specifically the invention relates to a method for drying a surface of a disc-shaped article comprising covering said surface with a rinsing liquid and displacing said rinsing liquid.

Methods for drying a surface of a disc-shaped article are typically used in semi-conductor industry for cleaning silicon wafer during production processes (e.g. pre photo clean, post CMP-cleaning, and post plasma cleaning). However, such a drying method may be applied for other plate-like articles such as compact discs, photo masks, reticles, magnetic discs or flat panel displays. When used in semiconductor industry it may also be applied for glass substrates (e.g. in silicon-on-insulator processes), III-V substrates (e.g. GaAs) or any other substrates or carriers used for producing integrated circuits.

DESCRIPTION OF THE RELATED ART

Several drying methods are known in semiconductor industry. Many drying methods use a defined liquid/gas boundary layer. Such drying methods are better known as Marangoni drying methods.

U.S. Pat. No. 5,882,433 discloses a combined Marangoni spin drying method. Thereby deionized water is dispensed onto a wafer and simultaneously a mixture of nitrogen with 2-propanol is dispense. The 2-propanol in the nitrogen shall influence the liquid/gas boundary layer in that a surface gradient shall occur, which leads to the effect that the water runs of the wafer without leaving any droplets on the wafer (Marangoni Effect). The gas dispenser directly follows the liquid dispenser while the liquid dispenser is moved from the centre to the edge of the wafer and while the wafer is spun and thereby gas directly displaces the liquid from the wafer.

This drying method is however very difficult to control. E.g. the distance of the liquid to the gas dispenser, temperature, gas flow, liquid flow are critical parameters. Thus the process window is very narrow especially for disc-shaped articles of larger diameter such as 300 mm semiconductor wafers and flat panel displays as well as for semiconductor wafers, which have higher integration e.g. 90 nm 65 nm device sizes.

Another disadvantage of the currently used method is that an organic and therefore flammable solvent vapour has to be mixed with a highly purified carrier gas. This leads on the one hand to fire hazardous situations and on the other hand to a drying gas with a much lower purity than could be achieved.

Furthermore the solvent vapour my condense in the gas piping, which may lead to droplets on the surface of the substrate to be dried, which further leads to bad process results specifically if the substrate is a highly integrated structured semiconductor wafer.

Therefore it is an object of the invention to provide a method with a better process result, which can be achieved with higher process ability.

Another object of the invention is to avoid impurities in a highly purified gas.

SUMMARY OF THE INVENTION

The invention meets the objects of the invention by providing a method for drying a surface of a disc-shaped article comprising covering said surface with a rinsing liquid, whereby a closed liquid layer is formed, and removing said rinsing liquid, wherein said rinsing liquid containing at least 50 wt. % water and at least 5 wt. % of a substance, wherein the substance lowers the surface energy of water, wherein said removing of the liquid is initiated by blowing gas onto said closed liquid layer, whereby the closed liquid layer is opened at a discrete area.

Such a substance can be called a surface active substance. However, per definition herein a surface active substance must be a substance capable of lowering the surface energy (surface tension) of water. This does not necessarily mean that it has to be a tenside or surfactant such as soap. It only shall mean that it shall comprise a molecule, which has a polar and an apolar end.

Because of environmental as well as cost reasons, the rinsing liquid should contain only water and the substance. However, any other aqueous solution may be used as long as it fulfills the above-mentioned criteria.

The use of at least 50 wt. % of water leads to the positive effect that the mixture has a flashpoint of above room temperature (25° C.) even when the remaining 50 wt. % are organic solvents. If 2-propanol or acetone is used the water content should be above 75% in order to raise the flashpoint above 20° C.

Surprisingly by using such an inventive drying method the rinsing liquid could be removed in one process step without leaving any droplets on the disc-shaped article.

This drying method is capable not only to dry hydrophilic surfaces of semi-conductor wafers but also hydrophobic surfaces and also structured surfaces having hydrophilic as well as hydrophobic areas.

Without being bound to any theory it is believed that the rinsing liquid forms a liquid film (liquid meniscus) on the surface, which can not be easily removed. The blowing of a gas onto said liquid film partly opens the liquid layer. Then because of the specific surface energy of the mixture comprising water and the substance the rinsing liquid automatically flows off the surface with only little additional support (e.g. gravity, centrifugal force, air flow, capillary force). However, it might be helpful to further blow gas onto the surface in order to keep the surface free from liquid.

In a preferred embodiment of the invention the substance is a dipolar organic solvent (e.g. selected from a group comprising, alcohols (e.g. ethanol, 2-propanol), ketones (e.g. acetone), and mixtures thereof).

Advantageously the dipolar organic solvent, which has a vapour pressure at 20° C. of above 15 hPa, is used because it easily vaporizes if residues adhere on the surface. Therefore 2-propanol is preferred because it serves as a surface active substance and at the same time easily vaporizes if residues adhere on the surface.

Although any gas might be used (e.g. clean air) advantageously the gas comprises an inert gas selected from the group of noble gases, carbon dioxide and nitrogen. This is because this further limits the fire risk and covers the surface with inert atmosphere, which avoids the formation of watermarks.

Merely because of avoiding fire hazardousness but also in order to minimize costs the gas substantially is free from any surface active substances (such as 2-propanol).

Said closed liquid layer being formed on the surface might be covered by a plate whereby a gap is formed by said plate and the disc-shaped article and thereby holding the liquid layer in the gap. In this case the liquid is directly displaced by the gas blown to the liquid layer. In this case the gas flow has to be precisely controlled so that the liquid is not accelerated to much so that droplets my be generated. Therefore it is helpful if the liquid layer is exposed to gas (e.g. the liquid layer is exposed to atmosphere).

In a preferred embodiment the surface is rinsed with a first rinsing liquid before said rinsing liquid is applied to the surface, wherein said first rinsing liquid is substantially free from any surface active substances. This helps to rinse of any previously applied liquids without the use of the additional substance.

In yet another embodiment said rinsing liquid contains at least 10 wt. % of the substance (preferably at least 15 wt. % of the substance.)

Advantageously the gas is blown to the surface in form of a merely punctiform supply of the gas, which means that the cross sectional area of the nozzle's mouth which supplies the gas shall not be more than 1 cm$^2$ (preferably not more than 0.2 cm$^2$).

The gas velocity shall be more than 3 m/s preferably 10 m/s because a minimum mechanical agitation is helpful in order to open the liquid layer covering the surface.

In an embodiment said gas is blown onto the surface with a nozzle, which is directed to an area of impact on the surface, the centre of which is not more than 30 mm off-set the centre of the disc-shaped article.

The efficiency of the drying method can be further enhanced if said disc-shaped article is rotated about an axis substantially perpendicular to said surface of the disc-shaped article during at least part of the time of displacing of the rinsing liquid.

Further details of the invention will become apparent by the following detailed examples.

A structured semiconductor wafer (300 mm diameter) is placed on a spin chuck and securely held by eccentrically movable pins. Several different aqueous cleaning liquids (e.g. SC1, SC2) are subsequently dispensed onto the wafer surface not facing the chuck. The last cleaning liquid (e.g. diluted hydrofluoric acid (DHF)) is directly displaced by dispensing DI-water onto the wafer at a flow of 2 l/min for 30 s. While dispensing DI-water the wafer spins at about 150 rpm. DHF as the last cleaning liquid leads to a hydrophobic or a partly hydrophobic surface.

Without interrupting the dispensing of the DI-water 2-propanol is added to the DI-water stream thereby forming a mixture of 75 wt. % water and 25 wt. %. Simultaneously spin speed is decelerated to 50 rpm. The mixture is dispensed onto the centre of the wafer for 5 s. Immediately thereafter spin speed is decelerated to 30 rpm and nitrogen is blown to the centre of the wafer out of a nozzle having an orifice diameter of 5 mm (0.2 cm$^2$ cross sectional area) at a flow of 20 l/min (gas velocity 17 m/s).

Thereby the liquid film of the rinsing liquid opens and the rinsing liquid smoothly flows off the wafer, softly supported by the slow spinning of the wafer. This leads to a sudden dry wafer.

In order to get rid of any rinsing liquid residues, which might have remained on the spin chuck or the bevel of the wafer the spin speed is accelerated again to 1300 rpm and all residues (droplets on the spin chuck and/or the bevel of the wafer) are spun off.

In an other example the nozzle, which blows the nitrogen, has an orifice diameter of 1.5 mm (1.8 mm$^2$ cross sectional area) and a flow of 5 l/min (gas velocity 47 m/s) is used.

BRIEF DESCRIPTION OF THE DRAWINGS

FIG. 1 illustrates a step of dispensing a rinsing liquid onto a rotating wafer.

FIG. 2 illustrates a step of blowing gas to open a liquid layer.
FIG. 3 illustrates a dried area formed on the wafer.
FIG. 4 illustrates a completely dried surface on the wafer.

DETAILED DESCRIPTION OF THE PREFERRED EMBODIMENTS

Figure 1:
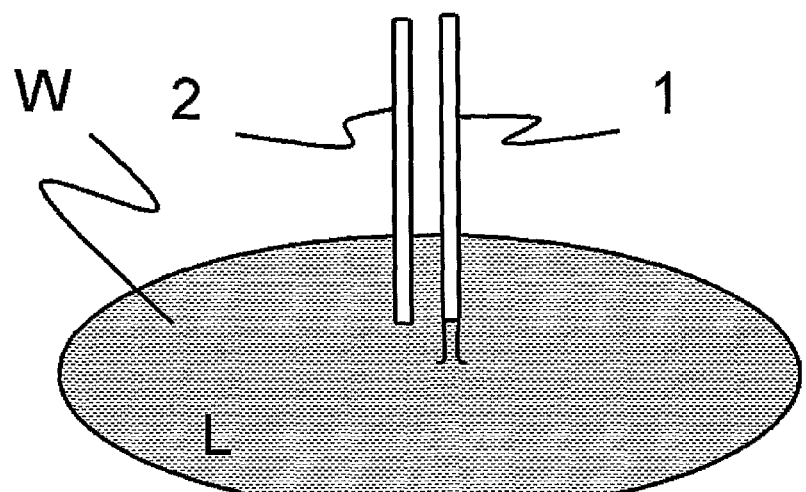
FIG. 1 to FIG. 4 show the above-described example.

In FIG. 1 the rinsing liquid is dispensed onto a rotating wafer W through liquid dispenser 1. Gas dispenser 2 is in waiting position. Rinsing liquid fully covers the wafer and thereby forms the liquid layer L.

Figure 2:
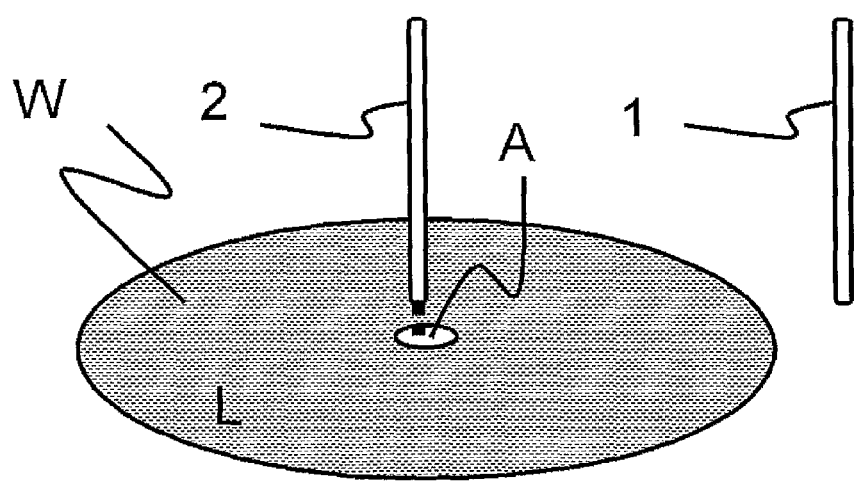

In FIG. 2 gas is blown through gas dispenser 2 and thereby opens the liquid layer in one small centric area A. Liquid dispensing has stopped in the meantime and liquid dispenser 1 has been put into standby position.

Figure 3:
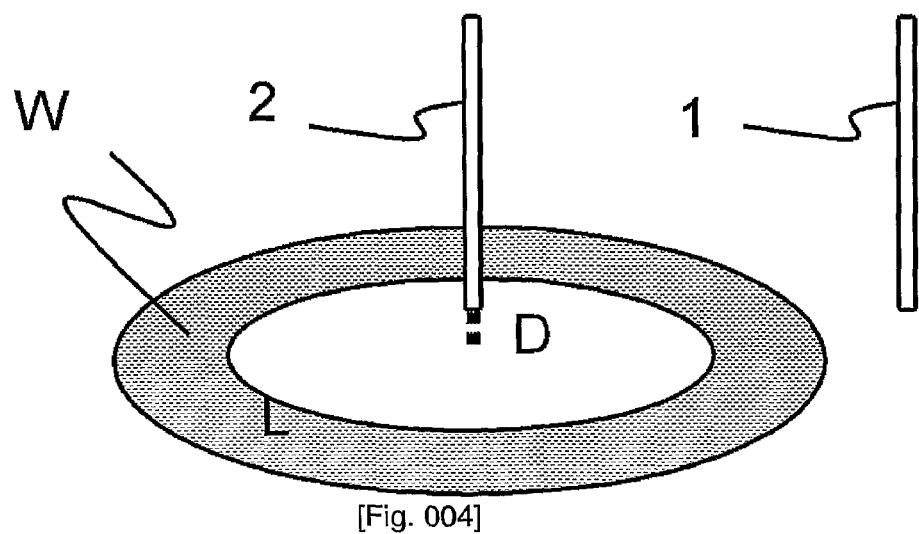

In FIG. 3, the situation after about a time of 10 s is shown. A dried area D on the disk has automatically become bigger. Gas is still dispensed (however not necessary).

Figure 4:
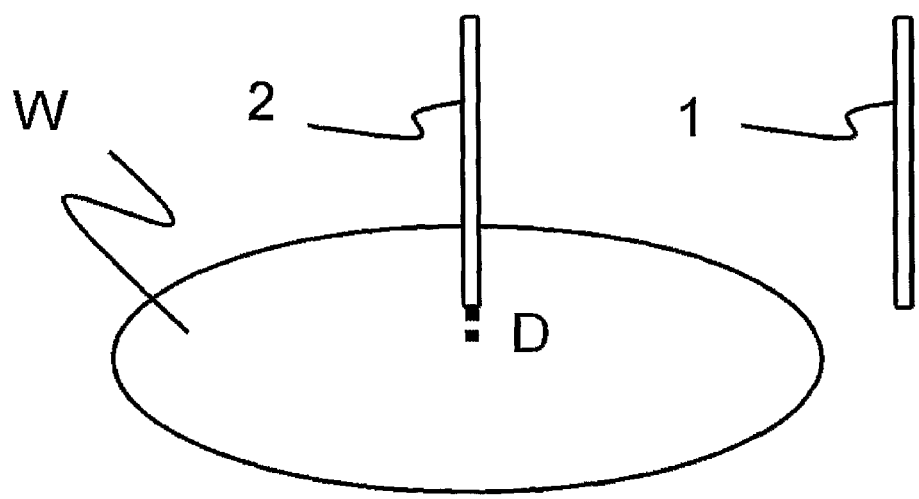

In FIG. 4 the wafer surface is now totally dried.

In an alternative example the wafer is held up-side-down on a spin chuck, which means that liquids and gas are supplied to the wafer from below. Alternatively both sides of the wafer can be dried simultaneously by using the same method e.g. with a spin chuck as disclosed in U.S. Pat. No. 6,536,454B2.

The invention claimed is:

1. A method for drying a surface of a disc-shaped article, comprising:
    covering said surface with a rinsing liquid to form a closed liquid layer; and
    removing said rinsing liquid,
    wherein said rinsing liquid contains at least 50 wt. % water and at least 5 wt. % of a substance,
    wherein the substance lowers the surface energy of water,
    wherein said removing step for removing the rinsing liquid is initiated by blowing gas onto said closed liquid layer, whereby the closed liquid layer is opened at a discrete area,
    wherein said surface has been rinsed with a first rinsing liquid before said rinsing liquid is applied to the surface, and
    wherein said first rinsing liquid is substantially free from any surface active substances.

2. The method according to claim 1, wherein the substance is a dipolar organic solvent.

3. The method according to claim 2, wherein the dipolar organic solvent has a vapor pressure at 20° C. of above 15 hPa.

4. The method according to claim 1, wherein the gas comprises an inert gas selected from the group of noble gases, carbon dioxide, and nitrogen.

5. The method according to claim 1, wherein the gas is free from any surface active substances.

6. The method according to claim 1, wherein said closed liquid layer being formed on the surface is exposed to the atmosphere.

7. The method according to claim 1, wherein said rinsing liquid contains at least 10 wt. % of a substance.

8. The method according to claim 7, wherein said rinsing liquid contains at least 15 wt. % of a substance.

9. The method according to claim 1,
    wherein the gas is blown to the surface through a nozzle, and
    wherein a cross sectional area of a nozzle of the mouth is not more than 1 cm$^2$.

10. The method according to claim 8, wherein said gas is blown onto the surface by way of a nozzle directed to an area of impact of the surface, the area of impact being not more than 30 mm from the center of the disc-shaped article.

11. The method according to claim 1, wherein the gas velocity of said gas blown to the surface is more than 3 m/s.

12. The method according to claim 1, wherein said disc-shaped article is rotated about an axis substantially perpendicular to said surface of the disc-shaped article during at least part of the time of displacing of the rinsing liquid.

13. The method according to claim 2, wherein the dipolar organic solvent is selected from the group consisting of alcohol, ketone, and mixtures thereof.

14. The method according to claim 13, wherein the alcohol is selected from the group consisting of ethanol and 2-propanol.

15. The method according to claim 13, wherein the ketone is acetone.

* * * * *